United States Patent
Chen et al.

(10) Patent No.: US 9,472,705 B2
(45) Date of Patent: Oct. 18, 2016

(54) INTEGRATED AVALANCHE GERMANIUM PHOTODETECTOR

(71) Applicants: IMEC VZW, Leuven (BE); Universiteit Gent, Ghent (BE)

(72) Inventors: Hongtao Chen, Leuven (BE); Joris Van Campenhout, Brussels (BE); Gunther Roelkens, Schellebelle (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 14/757,617

(22) Filed: Dec. 23, 2015

(65) Prior Publication Data

US 2016/0204298 A1    Jul. 14, 2016

(30) Foreign Application Priority Data

Dec. 22, 2014   (EP) ................... 14199730

(51) Int. Cl.
*H01L 31/107*   (2006.01)
*H01L 31/0232*  (2014.01)
*H01L 31/105*   (2006.01)
(Continued)

(52) U.S. Cl.
CPC ........... *H01L 31/107* (2013.01); *H01L 31/028* (2013.01); *H01L 31/02327* (2013.01); *H01L 31/105* (2013.01); *H01L 31/1808* (2013.01)

(58) Field of Classification Search
CPC .............. G02B 6/4295; H01L 31/105; H01L 31/1812; H01L 31/1075; H01L 31/028; H01L 31/107; H01L 31/1808; H01L 31/02327; Y02E 10/547
USPC .................... 257/186, 458; 438/91
See application file for complete search history.

(56) References Cited

U.S. PATENT DOCUMENTS 7,340,709 B1    3/2008  Masini et al.
7,397,101 B1 *  7/2008  Masini ................. H01L 31/028
                                                        257/184
(Continued)

FOREIGN PATENT DOCUMENTS

EP      2 736 084 A1    5/2014

OTHER PUBLICATIONS

European Search Report, European Patent Application No. 15152513.6 dated Jul. 17, 2015.
(Continued)

*Primary Examiner* — Thomas L Dickey
*Assistant Examiner* — Changhyun Yi
(74) *Attorney, Agent, or Firm* — McDonnell Boehnen Hulbert & Berghoff LLP

(57) ABSTRACT

An integrated avalanche photodetector and a method for fabrication thereof. The integrated avalanche photodetector comprises a Ge body adapted to conduct an optical mode. The Ge body comprises a first p-doped region that extends from a first main surface to a second main surface of the Ge body. The Ge body further comprises a first n-doped region that extends from the first main surface towards the second main surface of the Ge body. An intrinsic region occupies the undoped part of the Ge body. A first avalanche junction is formed by the first n-doped region that is located aside the p-doped region. The Ge body further comprises an incidence surface, suitable for receiving an optical mode, and a second n-doped Ge region that covers the Ge body and forms a second avalanche junction with the first p-doped region at the first main surface.

16 Claims, 5 Drawing Sheets

(51) Int. Cl.
*H01L 31/028* (2006.01)
*H01L 31/18* (2006.01)

(56) References Cited

U.S. PATENT DOCUMENTS

2012/0126286 A1* 5/2012 Na .................. H01L 31/105
257/186
2015/0340538 A1* 11/2015 Novack .............. H01L 31/1075
250/214 A

OTHER PUBLICATIONS

Vu, Vu A et al., "PIN Germanium Photodetector Fabrication Issues and Manufacturability", IEEE Transactions on Semiconductor Manufacturing, vol. 23, No. 3, Aug. 1, 2010, pp. 411-418.

Assefa, Solomon et al., "Reinventing Germanium Avalanche Photodetector for Nanophotonic On-Chip Optical Interconnects", Nature, vol. 464, Mar. 4, 2010, pp. 80-85.

Yin, Tao et al, "31 GHz n-i-p Waveguide Photodetectors on Silicon-On-Insulator Substrate", Optics Express, vol. 15, No. 21, Oct. 17, 2007, pp. 13965-13971.

Fedeli, Jean Marc et al., "High-Performance Waveguide-Integrated Germanium PIN Photodiodes for Optical Communication Applications", 7th International Silicon-Germanium Technology and Device Meeting (ISTDM), 2014, pp. 131-132.

Liow, Tsung-Yang et al., "Silicon Modulators and Germanium Photodetectors on SOI: Monolithic Integration, Compatibility, and Performance Optimization", IEEE Journal of Selected Topics in Quantum Electronics, vol. 16, No. 1, Jan./Feb. 2010, pp. 307-315.

Chen, H.T. et al., "Low-Voltage Ge Avalanche Photodetector for Highly Sensitive 10Gb/s Si Photonics Receivers", 2014 IEEE 11th International Conference on Group IV Photonics (GFP), Aug. 27-29, 2014, 2 pages.

Virot, Leopold et al., "Germanium Avalanche Receiver for Low Power Interconnects", Nature Communications, DOI:10.1038/ncomms5957, 2014, pp. 1-6.

Liow, Tsung-Yang et al., "Silicon Optical Interconnect Device Technologies for 40 Gb/s and Beyond", IEEE Journal of Selected Topics in Quantum Electronics, vol. 19, No. 2, Mar./Apr. 2013, pp. 12 pages.

* cited by examiner

Doping distribution

INTEGRATED AVALANCHE GERMANIUM PHOTODETECTOR

CROSS-REFERENCE TO RELATED APPLICATION

The present application is a non-provisional patent application claiming priority to European Patent Application No. 14199730.4 filed on Dec. 22, 2014, the contents of which are hereby incorporated by reference.

TECHNICAL FIELD

The present disclosure is related to an integrated avalanche germanium photodetector. The present disclosure also relates to a use of the integrated avalanche photodetector and to a method for fabrication thereof.

BACKGROUND

The field of planar integrated optical photodetector for telecommunication in the near IR band has generally utilized germanium (Ge) as an absorption layer, due at least in part, to the large absorption coefficient of Ge at the near IR wavelengths. Si is transparent at these IR wavelengths and generally unsuitable for use as a photodetector in such applications.

The paper "Germanium Avalanche Receiver for Low Power Interconnects," Nature Communications 5, Article number: 4957, by Leopold Virot et al., discloses a waveguide avalanche Ge photodiode capable of detection at 10 Gbit per second under low bias conditions. A lateral Ge PIN diode is described that has a thin (500 nm) Ge multiplication region and a Ge absorption region. Efficient butt-coupling was demonstrated by directly connecting the Si waveguide to the Ge absorption region. The dark current increases to 610 uA at −7V bias in avalanche conditions. The quality of the Ge crystal grown was verified by a low value of the dark current at low bias conditions, i.e. 18 nA at −1V bias.

The paper "Silicon Optical Interconnect Device Technologies for 40 Gb/s and Beyond," IEEE Journal of Selected Topics in Quantum Electronics, Vol. 19, No. 2, March/April 2013 by Tsung-Yang Liow et al., discloses that a lateral Ge PIN avalanche detector has a significant increase in dark current after being stressed for 15 minutes at a reverse bias of −9V, compared to a pristine unstressed device. The cause is believed to be related to mid-bandgap states which may be located at the Ge to cladding oxide interface. Some partial recovery was also observed.

There is a desire to limit the increase in dark current due to the application of an initial high reverse bias voltage for an avalanche photodiode.

SUMMARY

Embodiments of the present disclosure help to reduce the increase in the dark current after initial voltage stress of an integrated germanium (Ge) photodetector. It thus is an advantage of example embodiments of the present disclosure that the dark current increase in integrated Ge photodetectors, as for example observed in the above-referenced Liow paper, can be reduced.

In a first aspect, the integrated avalanche photodetector includes a Ge body adapted to conduct an optical mode. The Ge body may include a first p-doped region, for absorption of the optical mode, extending from a first main surface to a second main surface of the Ge body. The Ge body may also include a first n-doped region aside or generally adjacent (but not necessarily in contact with) the first p-doped region. The first n-doped region may extend from the first main surface towards the second main surface of the Ge body, and form a first avalanche junction with the first p-doped region. The Ge body may also include an intrinsic region that occupies the undoped part of the Ge body. The Ge body has an incidence surface that is suitable for receiving the optical mode, and is perpendicular to the first avalanche junction. According to the first aspect, the integrated avalanche photodetector includes a second n-doped Ge region that covers the Ge body and forms a second PN avalanche junction with the first p-doped region at the first main surface. The latter helps to reduce the increase in dark current of the integrated avalanche photodetector compared to, for example, the Ge avalanche photodetector described in the background above.

According to some example embodiments, the second PN avalanche junction, when in use, has a depletion zone that is spaced at least 20 nm from an upper main surface of the second n-doped Ge region. Spacing the mid-bandgap states, located at the upper main surface, from the depletion zone helps to prevent these mid-bandgap states at the upper main surface from undergoing or experiencing the high electric fields, needed for avalanche multiplication, and thus helps to prevent those mid-bandgap states from contributing to the dark current under avalanche conditions.

According to some example embodiments, the second n-doped Ge region may have the upper main surface perpendicular to the incidence surface. Such incidence surface can be used in a butt-coupling configuration, so that the optical mode can propagate into the absorption region in a direction parallel with the second n-doped Ge region.

According to some example embodiments, the second n-doped Ge region may be connected to a cathode electrode from the upper main surface of the second n-doped Ge region, and the first p-doped region may be connected to an anode electrode through a second p-doped semiconductor region, which is in direct contact with the first p-doped region at the second main surface. Such anode and cathode electrodes can be used to connect the photodetector in an electrical circuit.

According to some example embodiments, the first p-doped region is not in contact with a sidewall of the Ge body perpendicular to the incidence surface, which helps to further improve the dark current at avalanche conditions, as the high electric field is spaced from the mid-bandgap states of the Ge body at a sidewall.

According to some example embodiments, the first n-doped region may be in direct contact with the first p-doped region, and the first avalanche junction may be a PN avalanche junction, which may further lower the reverse bias voltage needed for avalanche conditions.

In a further aspect, the integrated avalanche photodetector, wherein the first n-doped region is spaced from the first p-doped region and the first avalanche junction is a PIN avalanche junction, helps to achieve a dark current reduction over conventional photodetectors.

According to some example embodiments, the first n-doped region may fully extend through the Ge body and may be connected to the cathode electrode through a third n-doped semiconductor region, which is in direct contact with the first n-doped region at the second main surface, and the first p-doped region may be connected to the anode electrode through the second p-doped semiconductor region, which may be in direct contact with the first p-doped region at the second main surface, thus providing an alternative electrical connection to an electrical circuit compatible with a planar integration technology.

According to some example embodiments, the integrated avalanche photodetector may further include a planar integrated semiconductor waveguide configured to couple the optical mode to the Ge body through the incidence surface, thereby forming an integrated waveguide avalanche photodetector that can be used in planar integration technologies.

According to some example embodiments, the integrated avalanche photodetector may further include a taper adapted to conduct the optical mode from the integrated semiconductor waveguide to the incidence surface, which may increase the coupling of an optical mode into the Ge body.

According to example embodiments, the integrated avalanche photodetector, wherein the second p-doped semiconductor region, the third n-doped semiconductor region and the integrated semiconductor waveguide are formed in a single planar semiconductor layer, is configured to be integrated in readily available planar semiconductor on insulator (SOI) substrates.

According to some example embodiments, the planar semiconductor layer may be silicon and the Ge body may be covered with silicon oxide.

In a second aspect, the present disclosure relates to the use of a photodetector for detecting radiation according to the first aspect, whereby such a photodetector, when in use at reverse bias conditions for avalanche multiplication, has a reduced dark current compared to, for example, the conventional Ge avalanche photodetector as described above.

According to some example embodiments, a reverse bias may be applied to the first avalanche junction and the second avalanche junction. When the reverse bias is increased to achieve avalanche multiplication in the first and second avalanche junctions, there is a reduction of the dark current compared to the conventional approaches described hereinabove. As the mid-bandgap states at the upper main surface are spaced from the first avalanche junction and the second avalanche junction by the second n-doped Ge region, this prevents the mid-bandgap states at the upper main surface from undergoing the high electric fields, needed for avalanche multiplication in the first avalanche junction and the second avalanche junction, and thus helps to prevent those the mid-bandgap states from contributing to the increase of the dark current under avalanche conditions.

A third aspect of the present disclosure relates to a method for fabricating an integrated avalanche photo detector according to the first aspect. According to one example, the method includes: providing an intrinsic Ge body adapted to conduct an optical mode; and doping a region, extending from a first main surface to a second main surface of the Ge body, with a p-type dopant to obtain a first p-doped region. In this example, the method also includes: doping a region extending from the first main surface towards the second main surface of the Ge body with a n-type dopant to obtain a first n-doped region; and forming a first avalanche junction with the first n-doped region located aside the first p-doped region. Further, this example method includes: providing an incidence surface on the Ge body suitable for optical mode incidence, perpendicular to the first avalanche junction; and providing a second n-doped Ge region that covers the Ge body to form a second PN avalanche junction with the first p-doped region at the first main surface.

In one example embodiment, providing the Ge body includes: providing a semiconductor layer; forming a second p-doped semiconductor region in the semiconductor layer, in the location where the first p-doped region will be formed; optionally forming a third n-doped semiconductor region in the semiconductor layer, in the location where the first n-doped region will be formed; and after doping the semiconductor layer, providing the Ge body on top of and in contact with the semiconductor layer at the second main surface.

DETAILED DESCRIPTION

Figure 1:
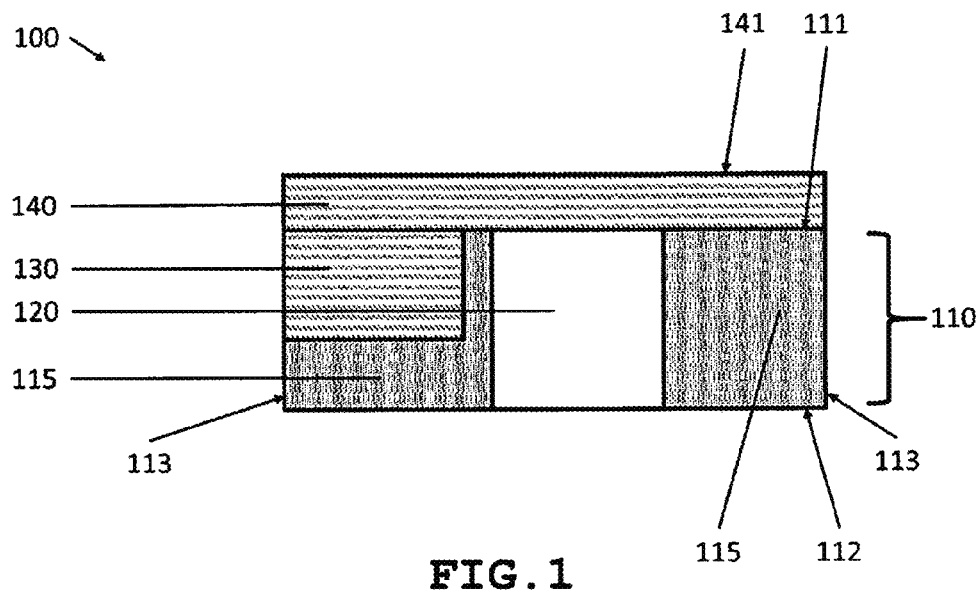
FIG. 1 illustrates a cross section of the integrated avalanche photodetector according to example embodiments of the present disclosure.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the following claims require more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any suitable combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The present disclosure relates to integrated germanium (Ge) avalanche photodetectors in semiconductor planar technology.

Figure 2:
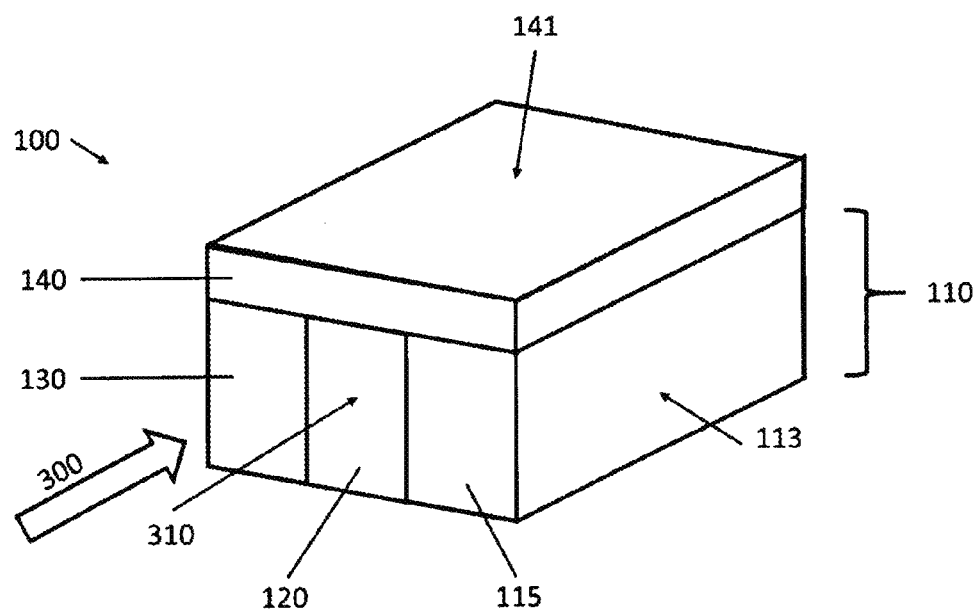
FIG. 2 illustrates an isometric view of the integrated avalanche photodetector according to example embodiments of the present disclosure.

In a first aspect, the integrated avalanche photodetector 100, as illustrated in FIG. 1, comprises a Ge body 110 adapted to conduct an optical mode. The Ge body 110 comprises a first p-doped region 120, for the absorption of an optical mode. The first p-doped region 120 extends from a first main surface 111 to a second main surface 112 of the Ge body 110. The Ge body 110 comprises a first n-doped region 130 that extends from the first main surface 111 towards the second main surface 112 of the Ge body 110. An intrinsic region 115 occupies the undoped part of the Ge body 110. A first avalanche junction is formed by the first n-doped region 130 that is located generally along a side of the p-doped region 120. The Ge body 110 comprises an incidence surface 310, suitable for receiving an optical mode 300 (as shown in FIG. 2, for example). In one example, the incidence surface 310 is perpendicular to the first avalanche junction. As illustrated in FIG. 2, for example, the first avalanche junction is parallel with the direction of the propagation of the optical mode. In one example, the first avalanche junction is perpendicular to the incidence surface 310.

In the present example, the Ge body 110 having a known refractive index is adapted in height and shape to conduct an optical mode along the absorption region. The absorption length is determined by the length of the first p-doped region 120 in the direction of the propagation of the optical mode. To help maximize the absorption of light from the optical mode in the first p-doped region, the absorption length is substantially equal to the length of the Ge body 110 in the direction of the propagation of the optical mode 300, from the incidence surface 310 to the surface opposite to the incidence surface 310. In this example, the first n-doped region 130 aside the first p-doped region, is aside the first p-doped region over the whole absorption length. The Ge body may be a GeSi compound comprising up to 10% of Si, for example.

Figure 9:
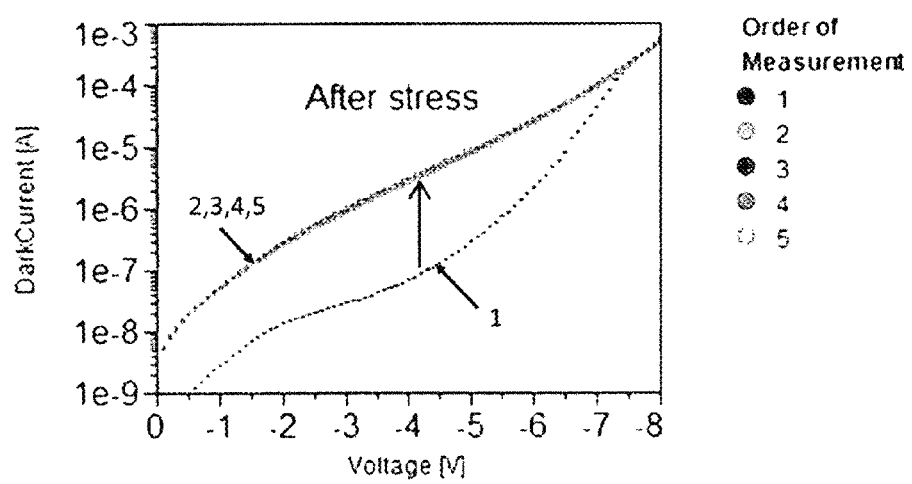
FIG. 9 illustrates measurements, of a Ge photodetector according to the prior art, before and after reverse bias voltage stress.

In FIG. 1, for example, a second n-doped Ge region 140 covers the Ge body 110 and forms a second PN avalanche junction with the first p-doped region 120 at the first main surface 111, and helps to reduce the dark current of the integrated avalanche photodetector compared to the Ge avalanche photodetector described in the background. The reduction of dark current, at a given reverse bias, can be more than twice, more than four times, or even six times or more with respect to dark current in conventional photodetectors, such as the Ge avalanche photodetector described in the background. FIG. 9 illustrates measurements of a conventional Ge photodetector, before (curve 1) and after reverse bias voltage stress (curves 2,3,4,5). FIG. 9 demonstrates the potential reduction in dark current at different reverse bias voltages.

According to example embodiments, the second PN avalanche junction when in use is reverse biased and a depletion zone is formed at the boundary of the first p-doped region 120 and the second n-doped Ge region 140. The high electric field in the depletion zone supports the avalanche multiplication. The depletion zone may be spaced at least 20 nm from an upper main surface 141 of the second n-doped Ge region 140. Spacing the mid-bandgap states, present at the upper main surface 141, from the depletion zone helps to prevent the mid-bandgap states at the upper main surface 141 from undergoing the high electric fields generated in part of the depletion zone and helps to prevent those mid-bandgap states from contributing to the dark current increase under avalanche conditions. To initiate and sustain avalanche multiplication when in use, the high electrical field is at least 200 kV per centimetre at a reverse bias of at least −4V. The high electrical field is contained in the depletion zone and is bent away from the upper main surface 141 by the distance of the depletion zone to the upper main surface 141 caused by the spacing.

The incidence surface 310 may be perpendicular to the first avalanche junction, and configured to allow for evanescent coupling through the second main surface 112 to the first p-doped region 120 of the Ge body 110 and to further allow for butt-coupling through the incidence surface 310. The upper main surface 141 may be perpendicular to the incidence surface 310, and the incidence surface 310 can then be used only in a butt-coupling configuration. In butt-coupling the optical mode can propagate through the incidence surface 310 into the Ge body 110 in a direction parallel with the second n-doped Ge region. It should be noted that the first main surface 111 is not an incidence surface 310, in this example.

According to example embodiments, the first p-doped region 120 is not in contact with a sidewall 113 of the Ge body 110 perpendicular to the incidence surface 310. Thus, the electrical field in the intrinsic region may be spaced from any sidewalls perpendicular to the incidence surface 310. This spacing helps to ensure that the mid-bandgap states at those sidewalls do not contribute to the dark current increase under high electric fields of avalanche operation. In one example, the first p-doped region 120 is in contact with the incidence surface 310 and with the surface of the Ge body 110 opposite to that.

According to example embodiments, the first n-doped region 130 is in direct contact with the first p-doped region 120 to form a PN avalanche junction at the first avalanche junction. The PN avalanche junction may further lower the reverse bias voltage needed to create the high electrical field for avalanche conditions and operation.

According to example embodiments, the first n-doped region 130 is spaced from the first p-doped region 120 to form a PIN avalanche junction at the first avalanche junction. The width of the intrinsic region of the PIN junction, caused by the spacing, is below 100 nm, for instance, to allow low voltage operation. It will be readily understood that a larger width of the intrinsic region of the PIN junction is possible.

According to example embodiments, the first n-doped region 130 may fully extend through Ge body 110. Further, the first n-doped region 130 may touch the second main surface, as illustrated in FIG. 2.

According to example embodiments, the first n-doped region 130 may be in direct contact with the sidewall 113 of the Ge body 110 perpendicular to the incidence surface 310, as illustrated in FIG. 2.

To achieve the high electrical fields required for avalanche multiplication at low reverse bias, the first p-doped region 120, the first n-doped region 130, and the second n-doped Ge region 140 may be highly doped.

The intrinsic region 115 may comprise unintentionally doped Ge, lightly p-doped Ge, lightly n-doped Ge, intrinsic Ge and/or undoped Ge. Nevertheless, the doping level typically is not limiting for example embodiments of the present disclosure. In some example embodiments, the doping levels may be below those from the first n-doped region and the first p-doped region.

To connect the avalanche photodetector in an electrical circuit an anode electrode 160 and a cathode electrode 150 may be used. The electrical circuit may be used to reverse bias the integrated avalanche photodetector.

Figure 3:
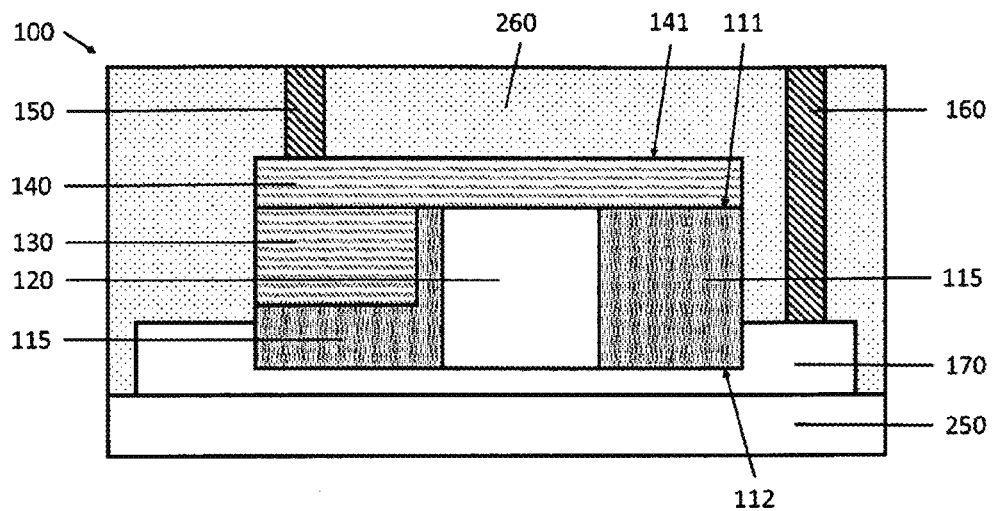
FIG. 3 illustrates a cross section of the integrated avalanche photodetector according to example embodiments of the present disclosure.
Figure 4:
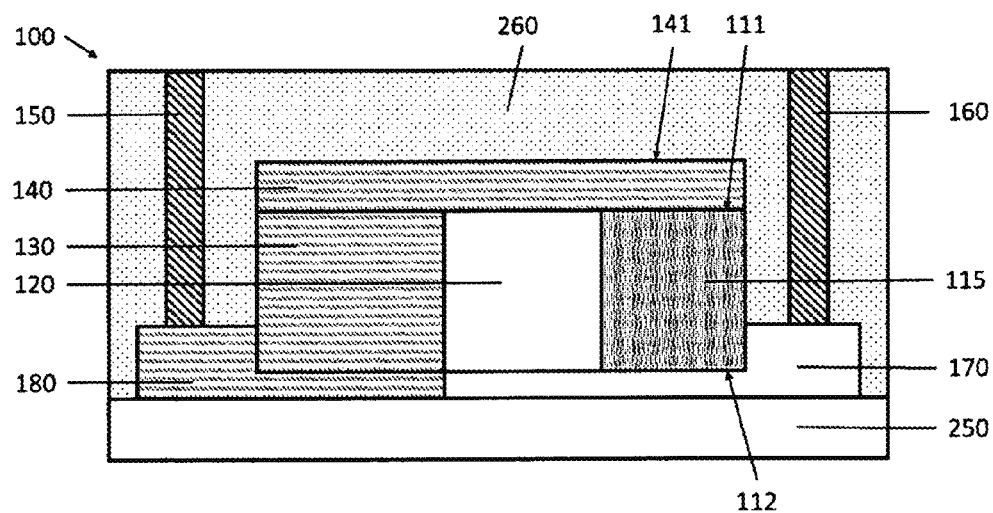
FIG. 4 illustrates a cross section of the integrated avalanche photodetector according to example embodiments of the present disclosure.

According to example embodiments, as illustrated in FIG. 3, the cathode electrode 150 is connected from the upper main surface 141. Optionally, as illustrated in FIG. 4, the cathode electrode 150 may be connected through a third n-doped semiconductor region 180, which is in direct contact with the first n-doped region 130 at the second main surface 112. The anode electrode 160 may be connected to the first p-doped region 120 through a second p-doped semiconductor region 170, which is in direct contact with the first p-doped region 120 at the second main surface 112.

According to example embodiments of the present disclosure, evanescent coupling of the optical mode through the second main surface 112 is possible through the second p-doped semiconductor region 170 or through the combination of the second p-doped semiconductor region 170 and the third n-doped semiconductor region 180. Evanescent coupling may be combined with butt-coupling as indicated herein.

Figure 5:
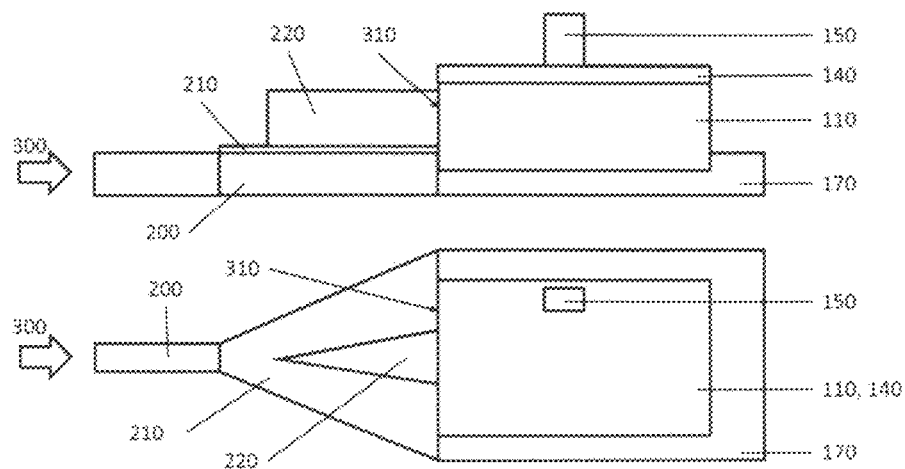
FIG. 5 illustrates a top and side view of an integrated waveguide avalanche photodetector according to example embodiments of the present disclosure.

According to example embodiments, such as illustrated in FIG. 5, the integrated avalanche photodetector may further comprise a planar integrated semiconductor waveguide 200, thereby forming an integrated waveguide avalanche photodetector. The planar integrated semiconductor waveguide 200 may be configured to couple the optical mode to the Ge body 110 through the incidence surface 310. Integrated waveguide avalanche photodetectors that use Ge for absorption at the wavelengths of interest, 1300 nm to 1600 nm, are contemplated herein. At the frequencies of interest, Si is transparent and can be used as a waveguide to propagate the optical mode. The photodetector may be readily integrated in current planar semiconductor technologies. The planar integrated semiconductor waveguide 200 propagating the optical mode, is at one end configured to couple the optical mode into the Ge body 110. The planar integrated semiconductor waveguide 200 is aligned with the Ge body 110, such that the direction of propagation, of the optical mode from the planar integrated semiconductor waveguide 200 into the Ge body 110, is in parallel with the first avalanche junction and that the optical mode propagates into the Ge body 110 over the absorption length. Due to the planar integration, the planar integrated semiconductor waveguide 200 has its main planar surfaces in parallel with the main surfaces 111, 112 of the Ge body 110, such that the direction of propagation of the optical mode in the planar integrated semiconductor waveguide 200 and the direction of propagation of the optical mode in the Ge body 110 will be in parallel planes.

This coupling can, for example, be achieved by a butt-coupling whereby the planar integrated semiconductor waveguide 200 is terminated at the incidence surface 310 of the Ge body 110. Alternatively, evanescent coupling to the Ge body 110 can be used through the second main surface 112, optionally combined with butt-coupling.

According to example embodiments, the integrated avalanche photodetector, wherein the second p-doped semiconductor region 170, the third n-doped semiconductor region 180, and the planar integrated semiconductor waveguide 200 are formed in a single planar semiconductor layer, as illustrated in FIG. 5.

The second main surface 112 of the Ge body 110 may be lower than the upper surface of the planar semiconductor layer as illustrated in FIG. 3, FIG. 4, and FIG. 5. The overlap of the integrated planar waveguide 200 with the Ge body 110 provides a first butt-coupling area, at the incidence surface 310.

According to example embodiments, the integrated waveguide photodetector, may further comprise a taper 220 adapted to conduct the optical mode from the integrated semiconductor waveguide to the incidence surface 310. The taper 220 is configured to enlarge the butt-coupling area and enhance the coupling of the optical mode into the Ge body 110. The taper 220 can further be adapted to concentrate the optical mode in the first p-doped region 120 where the absorption of the optical mode occurs.

According to example embodiments, the Ge body 110 may be epitaxially grown on a silicon (Si) layer of a SOI substrate. The dislocations on the Si layer/Ge body interface due to the lattice mismatch can be largely alleviated by process steps as known in the art. The Si SOI has a buried oxide (BOX), the BOX is SiO2. The BOX is underneath the Si layer, and may be used as bottom cladding for the planar integrated semiconductor waveguide 200, which may be made from the Si layer. The single planar semiconductor layer may be the Si layer of the Si SOI. The Si layer is a mono-crystalline layer. The second p-doped semiconductor region 170 may be formed in the Si layer. The third n-doped semiconductor region 180 may be formed in the Si layer.

The Ge body 110 may comprise a dielectric 260 that covers the Ge body 110, and may comprise SiO2, thereby leaving intact the mid-bandgap states at the upper main surface 141 and sidewalls 113 in contact with the dielectric 260. The dielectric 260 may be used to complete the waveguide cladding of the planar integrated semiconductor waveguide 200 as is known in the art. In one example, the dielectric is not GeO2, as this is soluble in water. The taper 220 can for example be made from poly-Si on top of an etch stop layer 210, for example a Si3N4 layer, the etch stop layer is on top of the mono-crystalline Si layer and transparent for the optical mode. SOI implementations for integrated waveguide avalanche photodetector are well known in the art and will not be detailed further.

In a second aspect, the present disclosure relates to the use of an avalanche photodetector according to the first aspect for detecting radiation, wherein a reverse bias is applied to the first avalanche junction and the second avalanche junction. The reverse bias may be applied to the n-doped regions of the junctions. The reverse bias may be applied through the second n-doped Ge region 140, optionally through the third n-doped semiconductor region 180, or both. The reverse bias is applied to the first p-doped region 120 through the second p-doped semiconductor region 170. The anode electrode 160 and cathode electrode 150 can be used to connect to the electrical circuit that provides the reverse bias. The reverse bias maybe high enough to allow for avalanche multiplication to take place in the photodetector.

In a third aspect, the present disclosure relates to a method for fabricating an integrated avalanche photodetector, the method comprising, providing an intrinsic germanium (Ge) structure that comprises a Ge body 110 and a second Ge region that covers the Ge body 110. In this example, the Ge body 110 is adapted to conduct an optical mode, and the Ge body 110 has a known refractive index and is adapted in height and shape to conduct an optical mode along the absorption region.

The method further comprises, doping the Ge structure, to form a first p-doped region 120, by implanting p-type dopants into a region extending from a first main surface 111 to a second main surface 112 of the Ge body 110. Known doping techniques may be applied to achieve a doping profile that has the main part of the p-type dopants in the Ge body and not in the second Ge region. Nevertheless, some residual doping may reside in the second Ge region.

The method further comprises, doping the Ge structure, to form a first n-doped region 130 by implanting n-type dopants into a region extending from a first main surface 111 towards a second main surface 112 of the Ge body 110. Known doping techniques may be applied to achieve a doping profile that has the main part of the n-type dopants in the Ge body and not in the second Ge region. Some residual doping may reside in the second Ge region.

The method further comprises forming a first avalanche junction by locating the first n-doped region 130 and the first p-doped region 120 aside each other. The first p-doped region 120 and the first n-doped region 130 may be in contact to form an avalanche PN junction. Alternatively, the first p-doped region 120 may be spaced from the first n-doped region 130 to form an avalanche PIN junction.

The method further comprises, providing an incidence surface 310 on the Ge body 110 suitable for optical mode incidence, perpendicular to the first avalanche junction.

The method further comprises doping the Ge structure, to form a second n-doped Ge region, by implanting n-type dopants into the second Ge region, wherein he n-type dopants extend to the first main surface 111 of the Ge body 110, and wherein the second n-doped Ge region covers the Ge body. Known doping techniques may be applied to achieve a doping profile that has the main part of the n-type dopants in the second Ge region and not in the Ge body 110.

Figure 6:
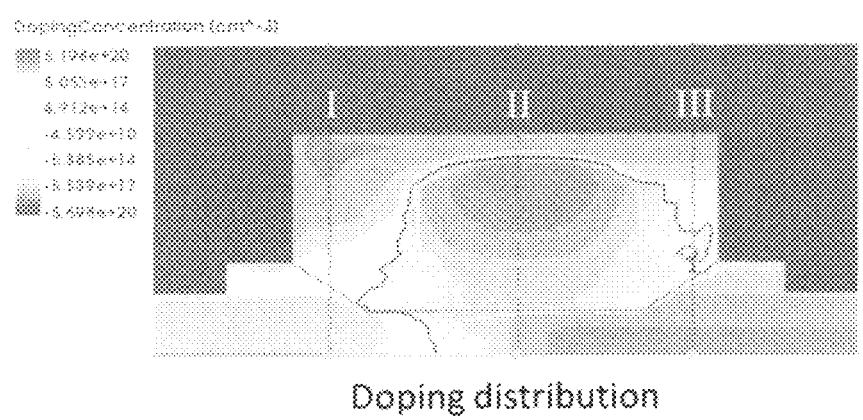
FIG. 6 illustrates doping concentrations according to an example embodiment of the present disclosure.
Figure 7:
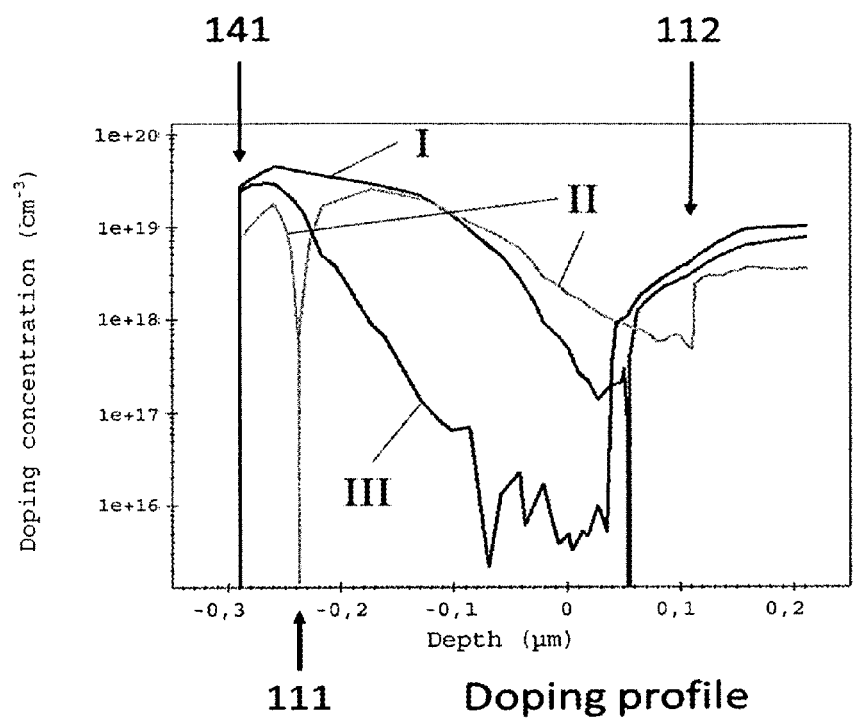
FIG. 7 illustrates doping profiles in a number of cross sections according to an example embodiment of the present disclosure.

It will be understood by the skilled person that doping profiles may be not abrupt and that more gradual doping transitions may exist. A certain decay in depth of the doping profile may exist in practical implementations according the embodiments of the present disclosure. FIG. 6 illustrates the doping concentration of an example integrated avalanche photodetector according to embodiments of the present disclosure. The cross section "I" goes through the first and second n-doped region of the Ge body 110 and shows a decay in depth towards the second main surface 112, as can be seen by the dark to light transition in FIG. 6. The cross section "II" goes through the second n-doped Ge region 140 and the first p-doped region 120. The cross section "III" goes through the second n-doped Ge region 140 and the intrinsic region 115 of the Ge body 110. FIG. 7 illustrates an example of applicable doping profiles, associated with the different cross sections of FIG. 6, and clearly illustrates the second PN avalanche junction at cross section "II". FIG. 7 further illustrates the lower doping concentration at cross section "III" with respect to cross section "I" as the depth increases going from the first main surface 111 to the second main surface 112, due to non-abrupt doping profiles and diffusion of the dopants.

According to example embodiments the method may further comprise, prior to providing the intrinsic Ge structure: providing a semiconductor substrate having a buried oxide (BOX) on top; providing a semiconductor layer on top of the BOX; forming a second p-doped semiconductor region 170 in the semiconductor layer, in the location where the first p-doped region 120 will be formed; and optionally forming a third n-doped semiconductor region 180 in the semiconductor layer, in the location where the first n-doped region 130 will be formed. The formation and doping of the semiconductor layer is well known in the art and will not be detailed.

According to example embodiments, the step of providing an intrinsic germanium (Ge) structure comprises growing epitaxial Ge on part of the semiconductor layer, where the Ge structure is to be provided at the second main surface 112. Techniques for epitaxial growth of Ge on semiconductor layers, for example mono-crystalline silicon, are known in the art and will not be detailed. Techniques are known in the art to minimize the impact, on dark current, of the dislocations at the semiconductor to Ge boundary cause by lattice mismatch.

According to example embodiments, an integrated waveguide is provided in the semiconductor layer configured to couple the optical mode to the Ge body (110) formed on the semiconductor layer.

Figure 8:
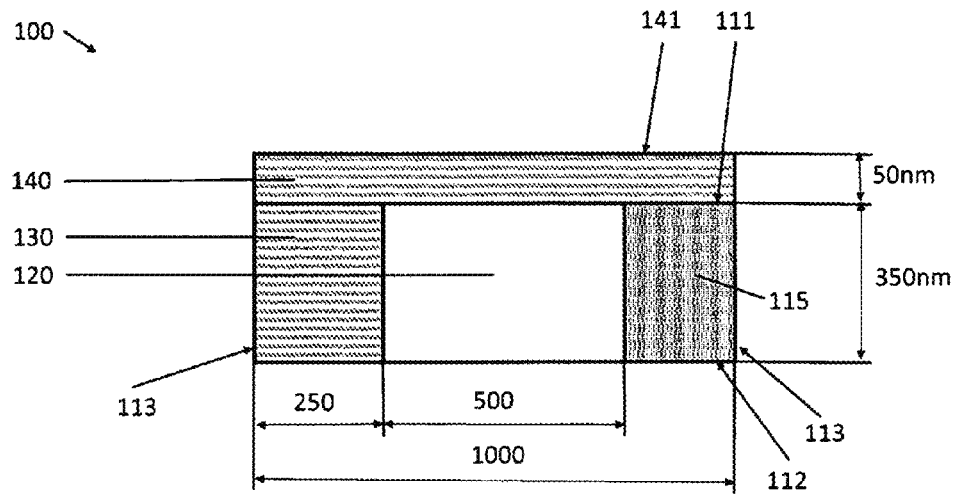
FIG. 8 illustrates an integrated avalanche photodetector according to an example embodiment of the present disclosure.

In an example embodiment of the integrated avalanche photodetector, provided by way of illustration in FIG. 8, the Ge body has a height of 350 nm measured between the first and second main surface 111,112; a width of 1000 nm, measured between the two sidewalls 113; a 50 nm thick second n-doped Ge region 140; a 500 nm wide first p-doped region 120 located between the two sidewalls 113; and a 250 nm wide first n-doped region 130 that extends over the full height of the Ge body 110 and is in contact with the first p-doped region 120. The configuration of FIG. 8 corresponds with a photodetector having a doping distribution as illustrated in FIG. 6 and FIG. 7. A noticeable difference is the slanted transition at the second main surface, which is due to the formation of the Ge structure and does not affect the inventive aspect of the present disclosure.

What is claimed is:

1. An integrated avalanche photodetector comprising:
   a germanium (Ge) body adapted to conduct an optical mode, wherein the Ge body comprises:
      a first p-doped region for absorption of the optical mode, wherein the first p-doped region extends from a first main surface to a second main surface of the Ge body;
      a first n-doped region aside the first p-doped region, wherein the first n-doped region extends from the first main surface towards the second main surface of the Ge body, and forms a first avalanche junction with the first p-doped region;
      an intrinsic region that occupies undoped parts of the Ge body;
      an incidence surface suitable for receiving the optical mode perpendicular to the first avalanche junction; and
      a second n-doped Ge region that covers the Ge body and forms a second avalanche junction with the first p-doped region at the first main surface.

2. The integrated avalanche photodetector according to claim 1, wherein a depletion zone of the second PN avalanche junction, when in use, is spaced at least 20 nm from an upper main surface of the second n-doped Ge region.

3. The integrated avalanche photo detector according to claim 1, wherein the second n-doped Ge region has an upper main surface perpendicular to the incidence surface.

4. The integrated avalanche photo detector according to claim 3, wherein:
   the second n-doped Ge region is connected to a cathode electrode from the upper main surface of the second n-doped Ge region; and
   the first p-doped region is connected to an anode electrode through a second p-doped semiconductor region, which is in direct contact with the first p-doped region at the second main surface.

5. The integrated avalanche photodetector according to claim 1, wherein the first p-doped region is not in contact with a sidewall of the Ge body perpendicular to the incidence surface.

6. The integrated avalanche photodetector according to claim 1, wherein the first n-doped region is in direct contact with the first p-doped region and the first avalanche junction is a PN avalanche junction.

7. The integrated avalanche photodetector according to claim 1, wherein the first n-doped region is spaced from the first p-doped region, and the first avalanche junction is a PIN avalanche junction.

8. The integrated avalanche photo detector according to claim 1, wherein;
   the first n-doped region fully extends through the Ge body and is connected to the cathode electrode through a third n-doped semiconductor region, which is in direct contact with the first n-doped region at the second main surface; and
   the first p-doped region is connected to the anode electrode through a second p-doped semiconductor region, which is in direct contact with the first p-doped region at the second main surface.

9. The integrated avalanche photodetector according to claim 1, further comprising a planar integrated semiconductor waveguide configured to couple the optical mode to the Ge body through the incidence surface, thereby forming an integrated waveguide avalanche photodetector.

10. The integrated avalanche photodetector according to claim 9, further comprising a taper adapted to conduct the optical mode from the planar integrated semiconductor waveguide to the incidence surface.

11. The integrated avalanche photo detector according to claim 9, wherein a second p-doped semiconductor region, a third n-doped semiconductor region, and the planar integrated semiconductor waveguide are formed in a single planar semiconductor layer.

12. The integrated avalanche photo detector according to claim 11, wherein the single planar semiconductor layer is silicon and the Ge body is covered with silicon oxide.

13. The integrated avalanche photodetector according to claim 1, wherein a reverse bias is applied to the first avalanche junction and the second avalanche junction.

14. A method for fabricating an integrated avalanche photo detector, the method comprising:
   providing a germanium (Ge) body of intrinsic germanium adapted to conduct an optical mode;
   doping a region, extending from a first main surface to a second main surface of the Ge body, with a p-type dopant to obtain a first p-doped region;
   doping a region, extending from the first main surface towards the second main surface of the Ge body, with a n-type dopant to obtain a first n-doped region;
   forming a first avalanche junction with the first n-doped region located aside the first p-doped region;
   providing an incidence surface on the Ge body suitable for optical mode incidence, perpendicular to the first avalanche junction; and
   providing a second n-doped Ge region that covers the Ge body to form a second avalanche junction with the first p-doped region at the first main surface.

15. The method according to claim 14, wherein providing the Ge body further comprises:
   providing a semiconductor layer;
   forming a second p-doped semiconductor region in the semiconductor layer, in the location where the first p-doped region will be formed; and
   after doping the semiconductor layer, providing the Ge body on top of and in contact with the semiconductor layer at the second main surface.

16. The method according to claim 15, wherein providing the Ge body further comprises:
   forming a third n-doped semiconductor region in the semiconductor layer, in the location where the first n-doped region will be formed.

* * * * *